United States Patent
Kumazaki et al.

(10) Patent No.: US 6,768,691 B2
(45) Date of Patent: Jul. 27, 2004

(54) SEMICONDUCTOR INTEGRATED CIRCUIT AND MEMORY SYSTEM

(75) Inventors: Noriyasu Kumazaki, Kanagawa (JP); Keiji Maruyama, Kanagawa (JP); Shigeo Ohshima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/241,908

(22) Filed: Sep. 12, 2002

(65) Prior Publication Data

US 2003/0047757 A1 Mar. 13, 2003

(30) Foreign Application Priority Data

Sep. 13, 2001 (JP) ........................................ 2001-278225

(51) Int. Cl.⁷ ................................................ G11C 7/00
(52) U.S. Cl. .............. 365/198; 365/189.05; 365/230.06
(58) Field of Search ............................ 365/198, 189.05, 365/230.06, 230.08, 233

(56) References Cited

U.S. PATENT DOCUMENTS

| | | | | |
|---|---|---|---|---|
| 5,289,413 A | * | 2/1994 | Tsuchida et al. | 365/189.02 |
| 5,999,483 A | | 12/1999 | Itou | 365/233 |
| 6,356,508 B1 | * | 3/2002 | Yoshimoto | 365/233 |
| 6,552,957 B2 | * | 4/2003 | Yagishita | 365/233 |
| 2001/0039602 A1 | * | 11/2001 | Kanda et al. | 711/105 |

* cited by examiner

Primary Examiner—Gene N. Auduong
(74) Attorney, Agent, or Firm—Hogan & Hartson, LLP

(57) ABSTRACT

A semiconductor integrated circuit, comprising: a first output driving part which outputs a data signal in sync with a reference clock signal; a second output driving part which outputs a data strobe signal prescribing a timing of said data signal; and a driving control part which separately controls driving ability of said first and second output driving parts.

19 Claims, 8 Drawing Sheets

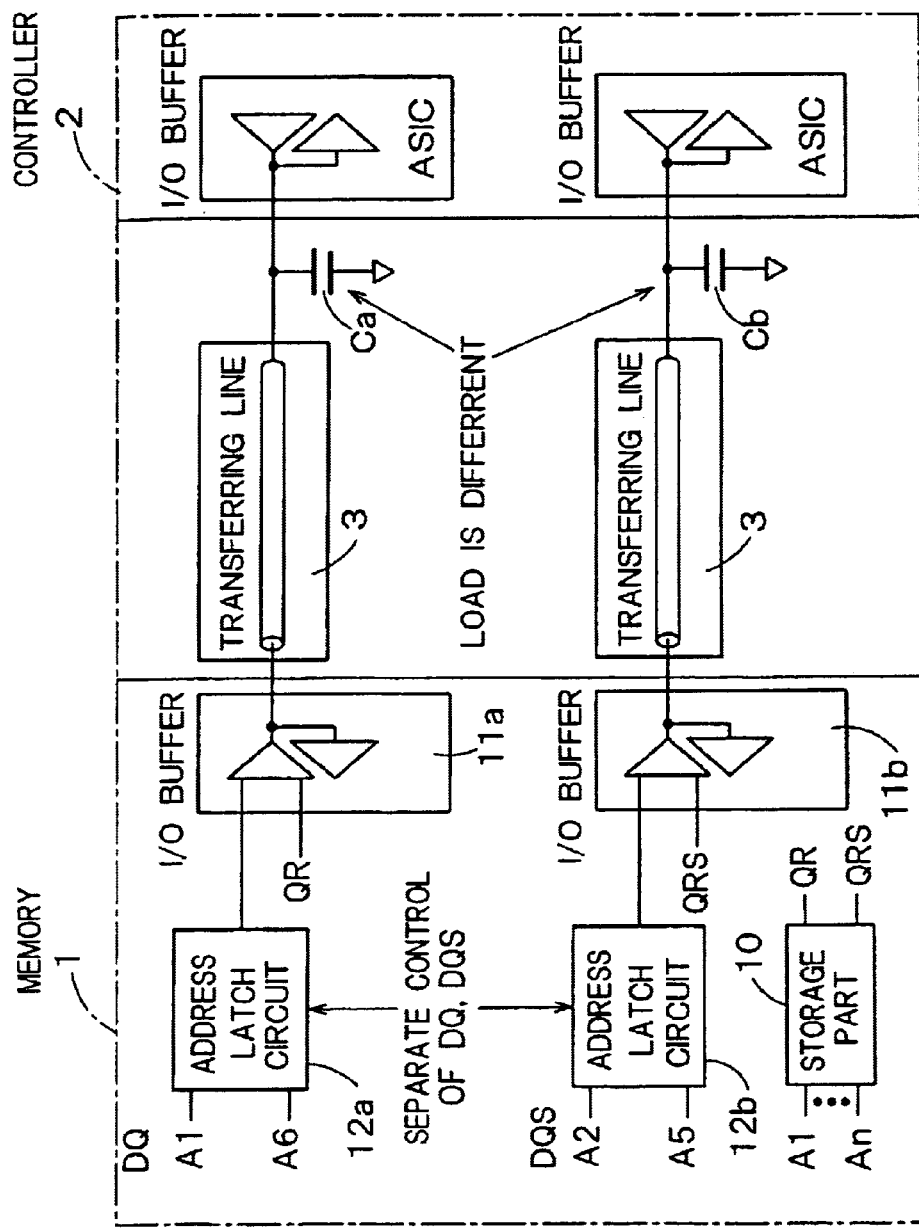
F I G. 1

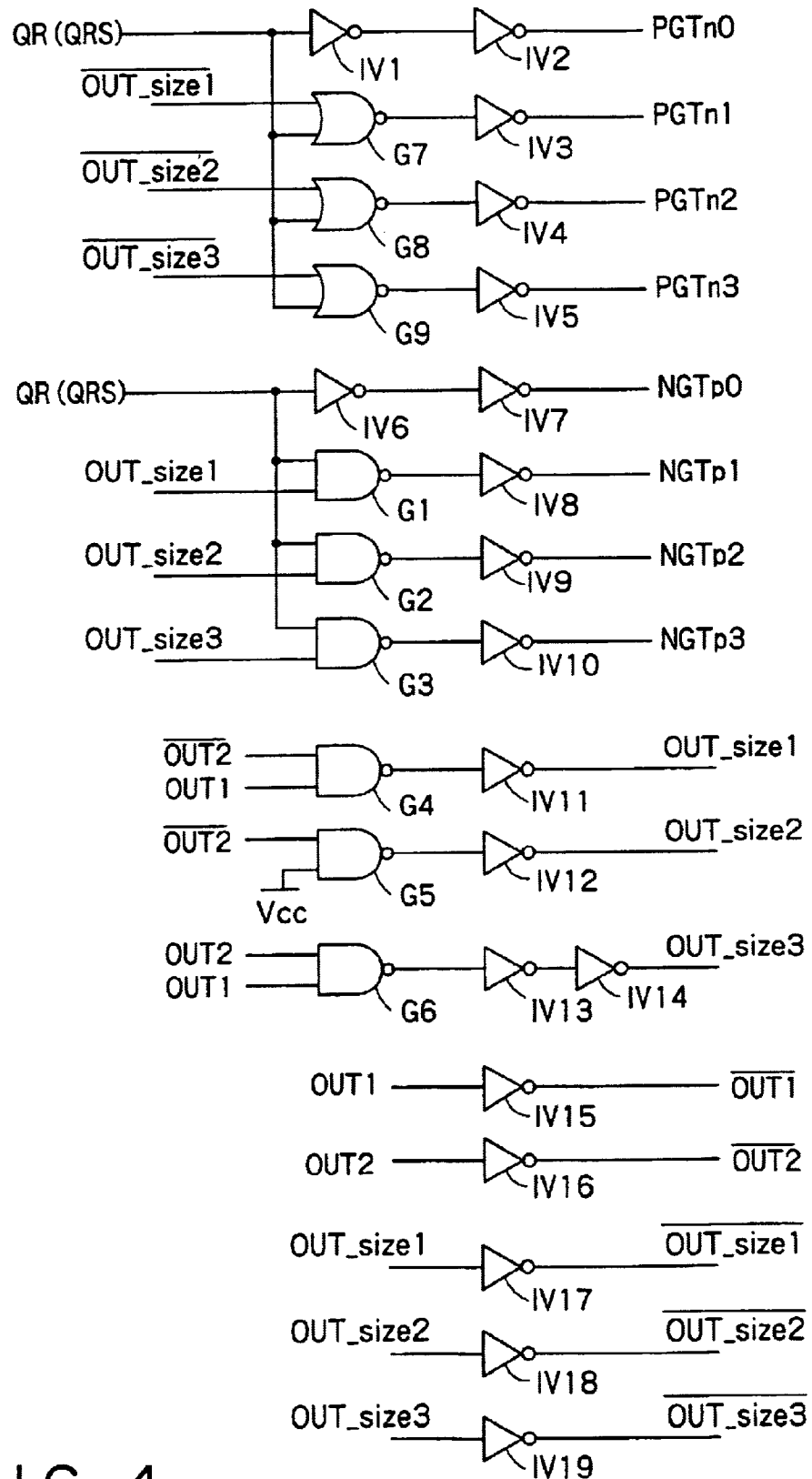
F I G. 4

| A1 | A6 | PGT<0> | PGT<1> | PGT<2> | PGT<3> | NGT<0> | NGT<1> | NGT<2> | NGT<3> | Driver size |
|----|----|--------|--------|--------|--------|--------|--------|--------|--------|-------------|
| L  | L  | E      | D      | E      | E      | E      | D      | E      | E      | Default     |
| L  | H  | E      | D      | D      | E      | E      | D      | D      | E      | Weaker      |
| H  | L  | E      | E      | E      | E      | E      | E      | E      | E      | Strong      |
| H  | H  | E      | D      | D      | D      | E      | D      | D      | D      | Weakest     |

E : Enable, D : Disable

FIG. 5

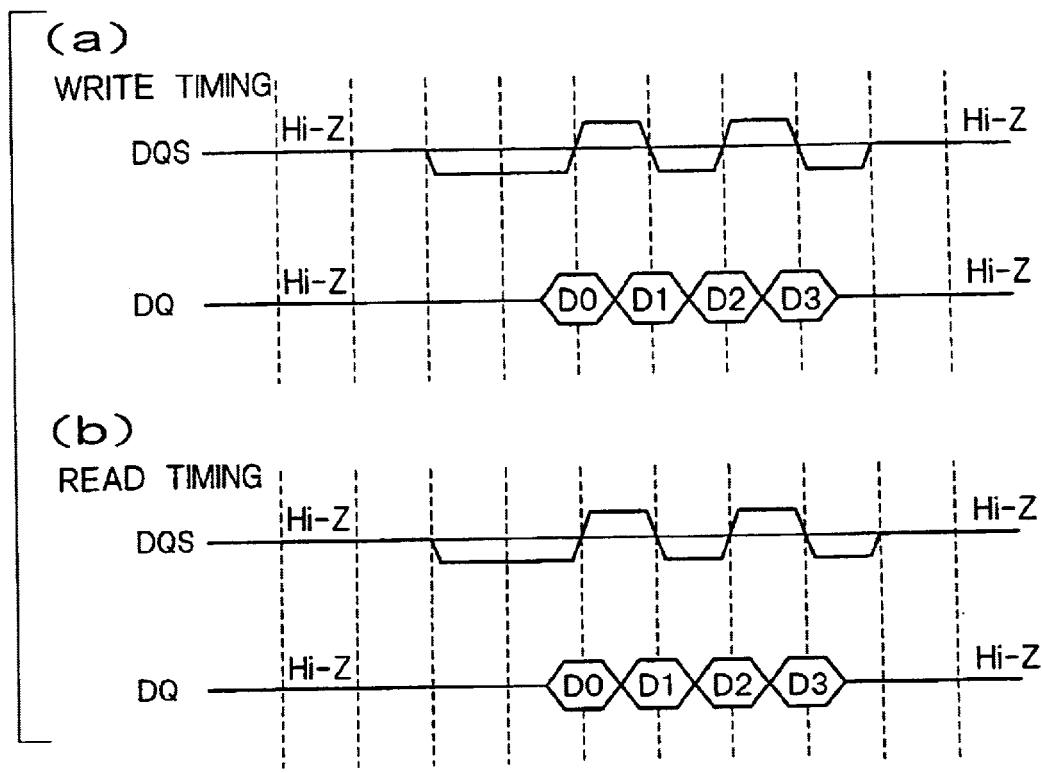
F I G. 6

DULL WAVEFORM
WITHOUT NOISE

DULL WAVEFORM
WITH NOISE

------- WITHOUT DULL WAVEFORM
———  WITH DULLWAVEFORM

SEMICONDUCTOR INTEGRATED CIRCUIT AND MEMORY SYSTEM

CROSS REFERENCE TO RELATED APPLICATIONS

This application is based upon and claims the benefit of priority from the prior Japanese Patent Applications No. 2001-278225, filed on Sep. 13, 2001, the entire contents of which are incorporated herein by reference.

BACKGROUND OF THE INVENTION

1. Field of the Invention

The present invention relates to a semiconductor integrated circuit and a memory system which output a data signal and a data strobe signal in sync with a reference clock signal.

2. Related Background Art

Recently, processors and memories have been used for various electric apparatuses. With speeding-up of processors and development of IT (Information Technology), a high speed memory has been required. According to the requirement, a memory such as a DDR SDRAM which transfers data at two fold frequency in sync with an external clock has been developed.

In a conventional SDR SDRAM (Single Data Rate Synchronous DRAM), data has been transferred in sync with only rising edges of the clock. On the other hand, in DDR SDRAM (Double Data Rate Synchronous DRAM), data is transferred in sync with both of rising edges and falling edges of the clock. Because of this, the DDR SDRAM can obtain two fold of the transferring speed of the SDR SDRAM.

However, the higher the data transferring speed becomes, the narrower a valid period of data (data window) becomes, and it becomes difficult to acquire data at a receiver side. Because of this, DDR SDRAM is newly provided with a data strobe signal (DQS), and the data is acquired based on this DQS at the receiver side.

The DQS is a bi-directional signal in sync with the clock and used for both of data write and read. At the write time, the DQS and the write data DQ are received from an ASIC side to write them into the memory. Conversely, at the read time, the DQS is outputted from the memory, and the DQS and the DQ for the data read are received at the ASIC side.

Thus, because the DQS is synchronized with the DQ, it is necessary to equalize a wiring length (trace length) of the DQS with that of the DQ.

Here, the problem due to the high speeding-up is the timing for acquiring data at the read time. FIG. 7 is a diagram showing the timing for acquiring data at the write time and the read time, with regard to the bi-directional DQS prescribed by JEDEC-DDR.

As shown in FIG. 7, although the data acquisition at the write and read times are carried out at both edges of the rising and falling edges of the DQS, the problem occurs at the read time.

In the data acquisition at the write time, as shown in FIG. 7A, the clock edges of the DQS locate at the vicinity of center of the valid period of the write data signal DQ. Because of this, it is possible to surely acquire data at the rising edges of the DQS.

On the other hand, as shown in FIG. 7B, in the read time when data is acquired at the controller side, both edges of the DQS and the changing points of the DQ are substantially the same timing. Because of this, as shown in FIG. 8, timing and phase of the DQS are staggered by using the DLL circuit and the PLL circuit at the controller side, and the timing has to be adjusted so that both edges of the DQS are located at the vicinity of an intermediate point of the valid period of data.

However, as mentioned above, it is a burden for the controller side to provide the DLL circuit or the PLL circuit to the controller side. As a method of adjusting timing between the DQ and the DQS without providing the DLL circuit or the PLL circuit to the controller side, there is a method of adjusting wiring length between the memory and the controller. If the wiring length of the DQS is set to be longer than that of the DQ, the wiring delay time of the DQS becomes long in proportion to that of the DQ, and the DQS at the controller side can be set to the vicinity of the intermediate point of the valid period of data.

However, by the difference such as arrangement of patterns and the amount of load, the capacitance load of the DQS may become larger than that of the DQ. In this case, the rising and falling waveforms of data dull, and it becomes difficult to enlarge margin of the valid period of data.

FIG. 9 is a block diagram showing schematic configuration of a conventional memory system. The memory system of FIG. 9 has a controller 52 composing a memory 51 and an ASIC implemented on a print substrate. The memory 51 and the controller 52 sends and receives data via a transferring line 53 on the print substrate.

The memory 51 has a storage part 50 for inputting/outputting a data signal QR based on external address signals A1–An and inputting/outputting the data strobe signal QRS in sync with a data signal QR, an I/O buffer 54a for inputting/outputting the data signal DQ relating to the data signal QR, an I/O buffer 54b for inputting/outputting the data strobe signal DQS relating to the data strobe signal QRS, and an address latch circuit 50 for controlling driving ability of the I/O buffer 54a, 54b based on the external address signals A1 and A6.

Because the conventional address latch circuit shown in FIG. 9 does not separately adjust driver sizes of the I/O buffers 54a and 54b, it was impossible to perform fine adjustment of the DQ and the DQS in a simple method of extending trace length.

Furthermore, in the conventional address latch circuit, the driving ability of the I/O buffers 54a and 54b has been set to be equal to each other. Because of this, if the amount of load of the transferring path of the DQ is not equal to that of the DQS, the signal waveform on the transferring path with a large amount of the load may dull.

FIGS. 10A–10B are a signal waveform diagram of the DQ and the DQS. FIG. 10A is a signal waveform diagram in the case of not being influenced by noise, and FIG. 10B is a signal waveform diagram in the case of being influenced by noise. Solid lines of these diagrams show the case where the waveform dulls, and dotted lines thereof show the case where the waveform does not dull.

As evidenced by these diagrams, timing is staggered by with or without noise. If the waveform dulls, the signal changes gradually, and as a result, a timing when logic changes staggers. For example, in FIG. 10A, if the original time when logic of the signal changes is time x0, the time staggers to time x1 by dulling of the signal waveform. Similarly, when there is noise and the waveform also dulls, the time staggers to time x2.

Thus, in the conventional memory system, the driving ability of the DQ and the DQS has not been separately controlled in the memory. Because of this, even if only the trace length is just extended, the waveform dulls by the change of the load, thereby complicating the timing adjustment. Accordingly, timing adjustment of the DQ and the DQS has to be performed by using the DLL circuit and the PLL circuit at the controller side, thereby complicating the inside configuration of the controller.

SUMMARY OF THE INVENTION

A semiconductor integrated circuit according to an embodiment of the present invention, comprising:

a first output driving part which outputs a data signal in sync with a reference clock signal;

a second output driving part which outputs a data strobe signal prescribing a timing of said data signal; and a driving control part which separately controls driving ability of said first and second output driving parts.

Furthermore, a memory system according to an embodiment of the present invention, comprising:

a storage part which outputs a data signal corresponding to a designated address and a data strobe signal prescribing a timing of said data signal;

a first output driving part which outputs said data signal in sync with a reference clock signal;

a second output driving part which outputs said data strobe signal in sync with said data signal; and a driving control part which separately controls driving ability of said first and second output driving parts.

BRIEF DESCRIPTION OF THE DRAWINGS

FIG. 1 is a diagram showing schematic configuration of an embodiment of a memory system according to the present invention.

FIG. 4 is a block diagram showing internal configuration of the gate signal generating circuit.

FIG. 5 is a logic diagram of the address signal and the output of the control signal generating circuit.

FIG. 6 is a diagram showing the timing relationship of the data strobe signal (DQS) and the data signal (DQ) outputted from the I/O buffer.

DESCRIPTION OF THE PREFERRED EMBODIMENTS

Figure 2:
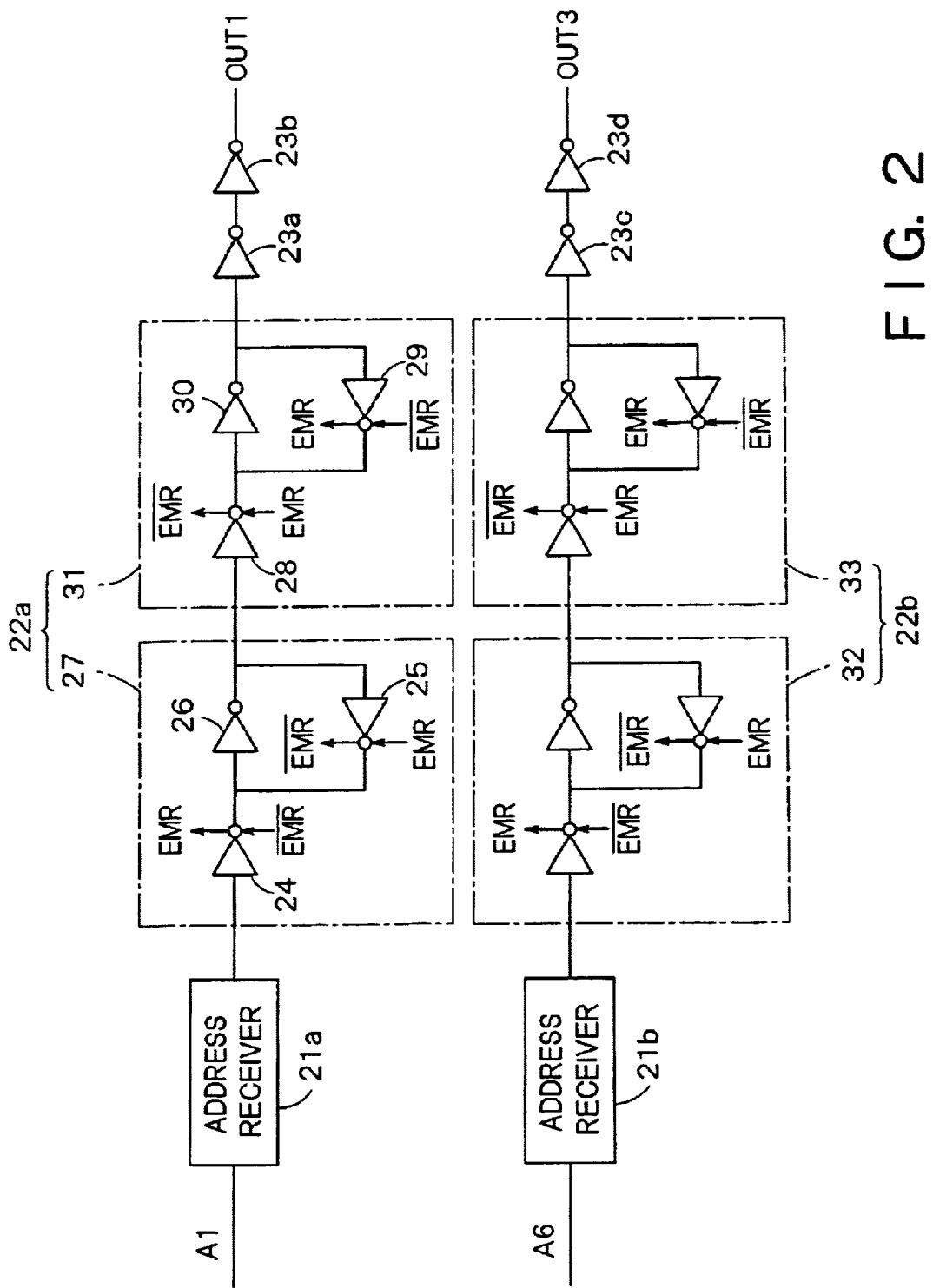
FIG. 2 is a block diagram showing internal configuration of the address latch circuit.

Hereinafter, a semiconductor integrated circuit and a memory system according to the present invention will be more specifically described with reference to drawings.

FIG. 1 is a block diagram showing schematic configuration of an embodiment of a memory system according to the present invention. The memory system of FIG. 1 has a memory 1 and a controller 2 composing an ASIC. The memory 1 and the controller 2 send and receive data via transferring lines 3 formed on a print substrate.

The controller 2 of FIG. 1 supplies the data signal DQ and the data strobe signal DQS to the memory 1 during the write time. On the other hand, the memory 1 supplies the DQ and the DQS to the ASIC during the read time.

The memory 1 has a storage part 10 for inputting/outputting a data signal QR based on external address signals A1–An and inputting/outputting the data strobe signal QRS in sync with a data signal QR, an I/O buffer 11a for inputting/outputting the data signal DQ relating to the data signal QR, an I/O buffer 11b for inputting/outputting the data strobe signal DQS relating to the data strobe signal QRS, and an address latch circuit 12a for controlling driving ability of the I/O buffer 11a based on the external address signals A1 and A6, and an address latch circuit 12b for controlling driving ability of the I/O buffer 11b based on the external address signals A2 and A5.

The storage part 10 is, for example, a core part of a DDR SDRAM (Double Data Rate Synchronous DRAM) and a peripheral circuit thereof.

Figure 9:
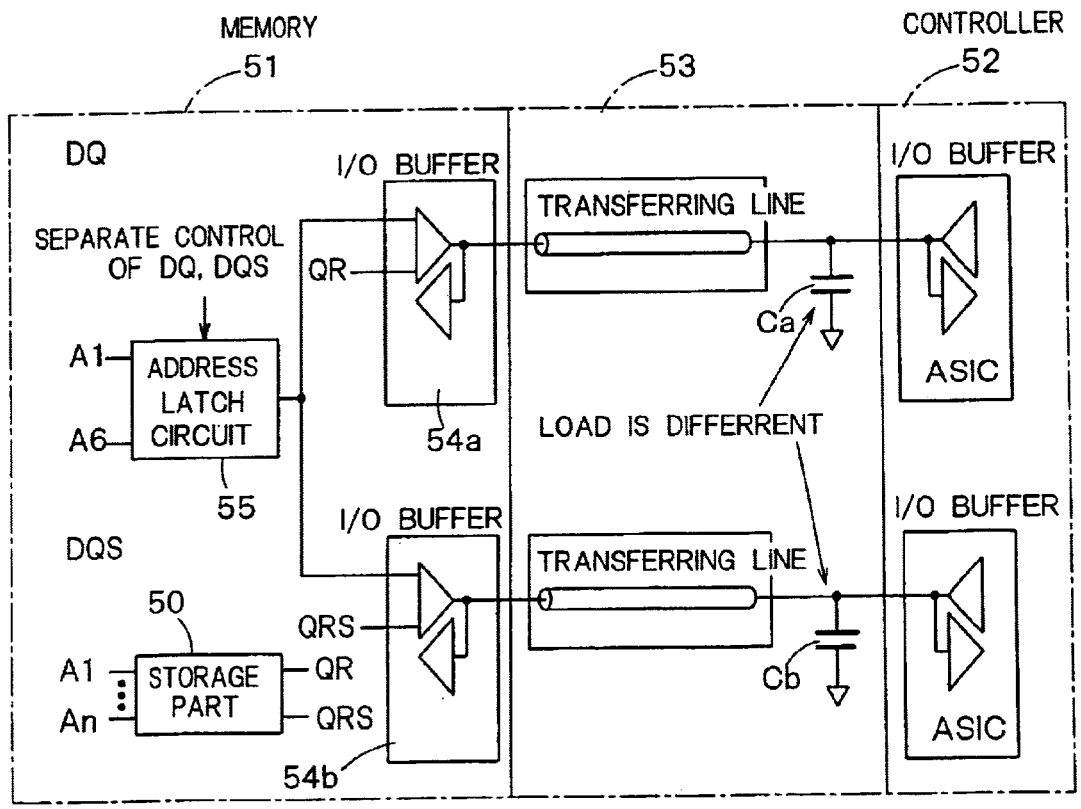
FIG. 9 is a block diagram showing schematic configuration of the conventional memory system.
Figure 10A:
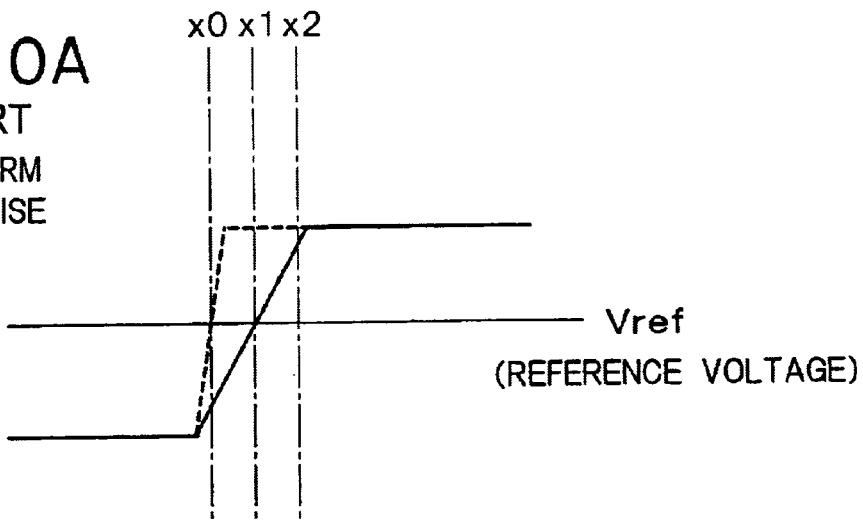
FIGS. 10A–10B are signal waveform diagrams of the DQ and the DQS.
Figure 10B:
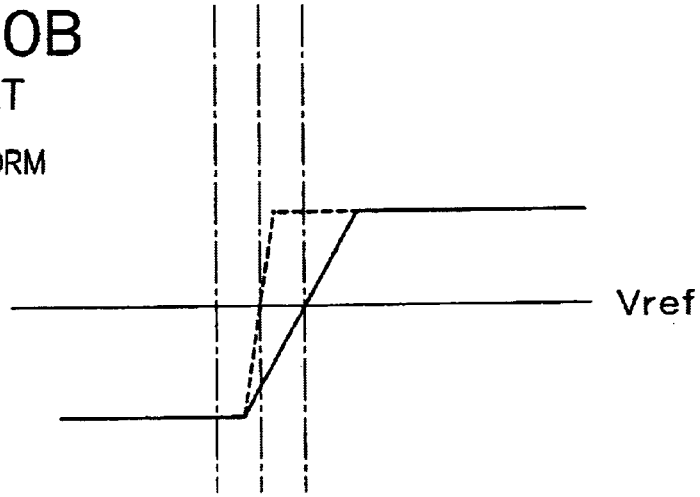

In the memory system of the present embodiment, compared with the conventional memory system shown in FIG. 9, address latch circuits 12a and 12b are provided corresponding to the I/O buffers 11a and 11b, respectively, and timings of the DQ and the DQS can be adjusted separately.

FIG. 2 is a block diagram showing internal configuration of the address latch circuit 12a. The address latch circuit 12a of FIG. 2 has address receivers 21a and 21b for acquiring the external address signals A1 and A6, flipflops 22a, 22b and inverters 23a–23d.

The flipflops 22a and 22b latch logic value of the external address signals A1 and A6 by an EMR signal clocked in the case set to an extended mode. In the case except the extended mode, the flipflops 22a and 22b continues to hold logics of the latched A1 and A6.

The external address signals (A1, A6) inputted to the address latch circuit 12a and the external address signals (A2, A5) inputted to the address latch circuit 12b are used for address designation of the memory 1 at time except the extended mode. The memory 1 of the present embodiment controls driving ability of the I/O buffers by using a portion (A1, A6) or (A2, A5) of the external address signals used for memory access, in order to prevent increase of the number of terminals of the memory 1.

The flipflop 22a has a latch circuit 27 composing clocked inverters 24 and 25 and an inverter 26, and a latch circuit 31 composing clocked inverters 28 and 29 and an inverter 30.

The latch circuit 27 acquires the external address signal A1 when the clock signal EMR is in low level, and fixes and latches logic value of the external address signal A1 when the clock signal EMR changes from low level to high level. The latch circuit 31 acquires the output of the latch circuit 27 when the clock signal EMR is in high level, and fixes and latches the logic value of the external address signal A1 when the clock signal EMR changes from high level to low level.

Similarly, the latch circuit 32 in the flipflop 22b acquires the external address signal A6 when the clock signal EMR is in low level, and latches the logic value of the external address signal A6 when the clock signal EMR changes from low level to high level. The latch circuit 33 acquires the output of the latch circuit 32 when the clock signal EMR is in high level, and fixes and latches the logic value of the external address signal A6 when the clock signal EMR changes from high level to low level.

Although FIG. 2 has shown the internal configuration of the address latch circuit 12a, the address latch circuit 12b has also the similar configuration as that of FIG. 2. The address latch circuit 12b is supplied with the external address signals A2 and A5.

Figure 3:
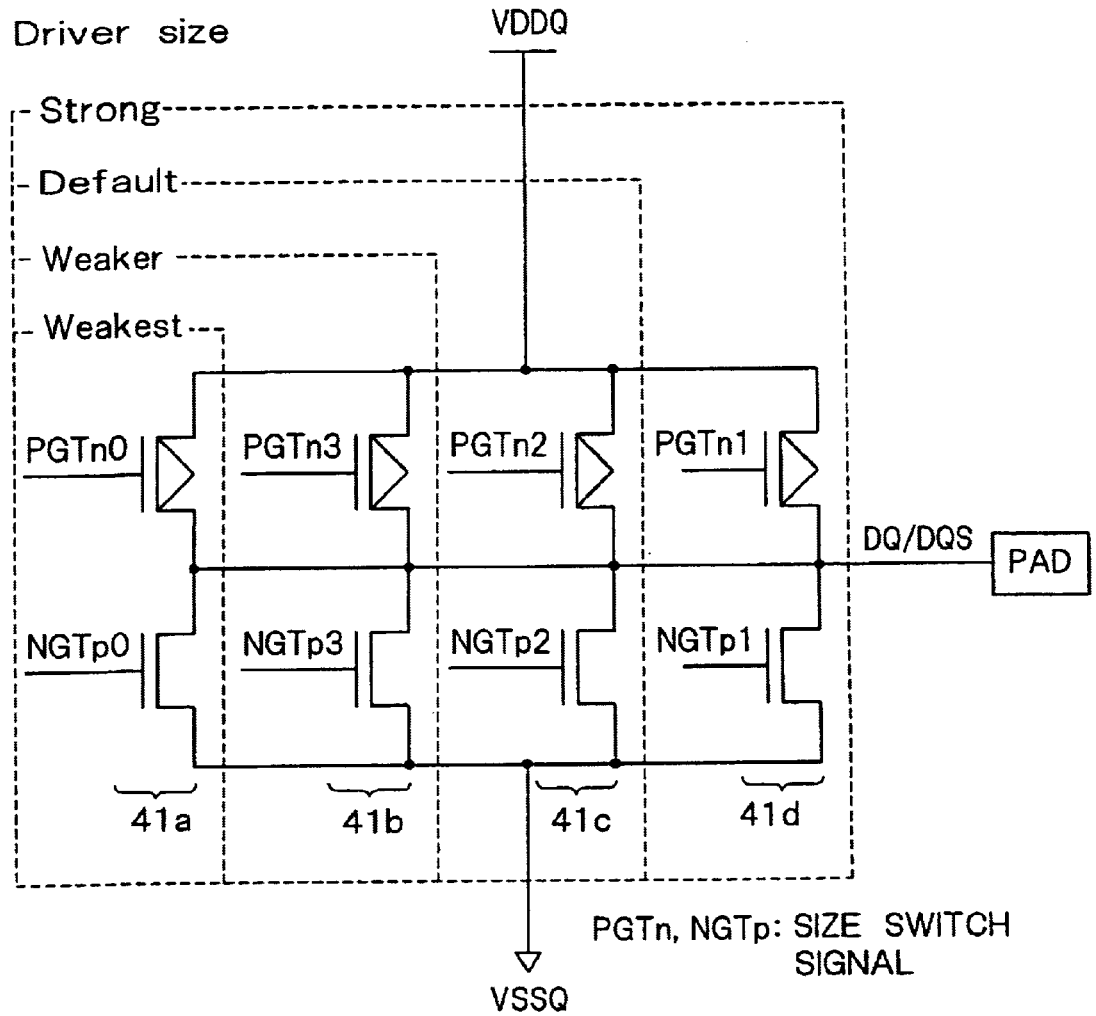
FIG. 3 is a block diagram showing internal configuration of the I/O buffer.
Figure 3:
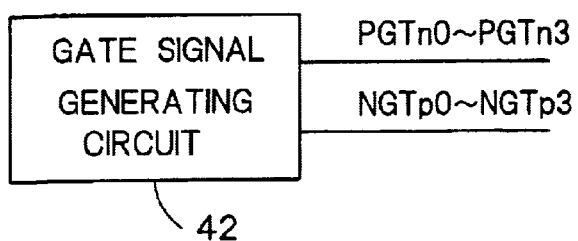
Figure 7:
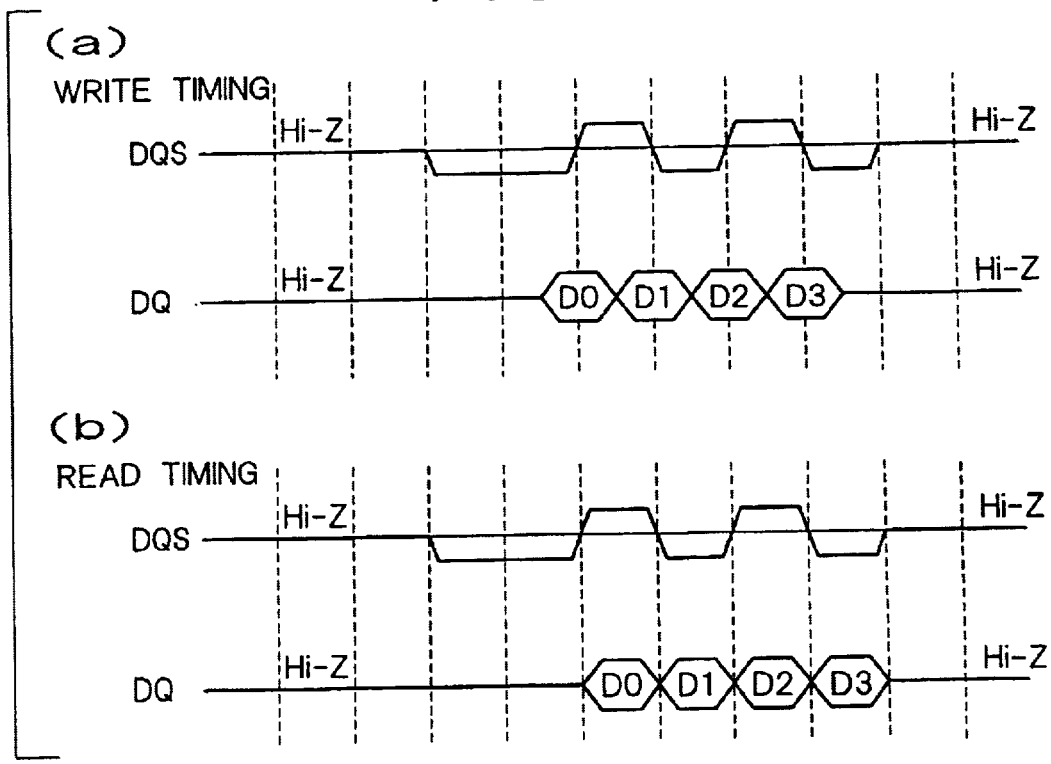
FIG. 7 is a diagram showing the timings for acquiring data at write time and read time, with regard to the bi-directional DQS prescribed by JEDEC DDR.
Figure 8:
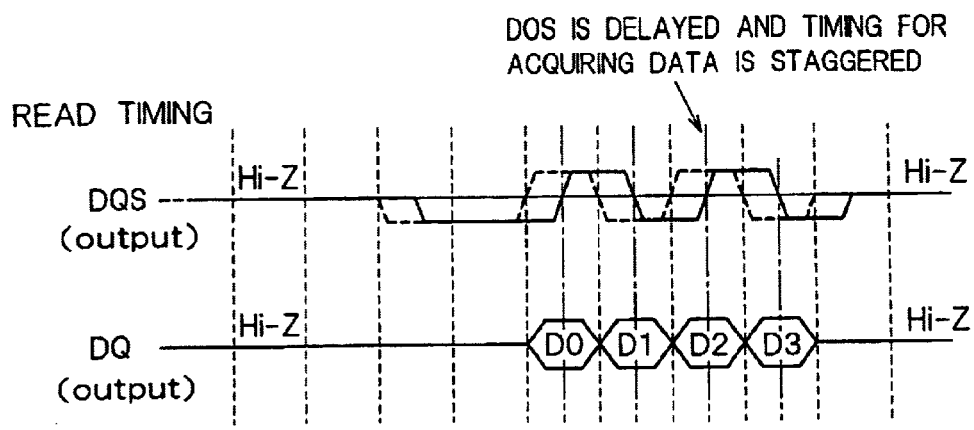
FIG. 8 is a diagram describing an example of performing timing adjustment so that both edges of the DQS are located at the vicinity of the center of the data valid period.

As the detailed configuration is shown in FIG. 3, the I/O buffer 11a has a plurality of transistor groups 41a–41d each having a PMOS transistor and an NMOS transistor connected in series between a power supply terminal VDDQ and a ground terminal VSSQ, and a gate signal generating circuit 42 for generating gate signals PGTn0–PGTn3 and NGTp0–NGTp3 of each transistor group.

A connection point of the PMOS transistor and the NMOS transistor in each of transistor groups 41a–41d is connected to the output terminal of the I/O buffer 11a. As shown in the detailed configuration of FIG. 4, the gate signal generating circuit 42 has NAND gates G1–G6, NOR gates G7–G9 and inverters IV1–IV19.

The outputs PGTn0–PGTn3 and NGTp0–NGTp3 of the gate signal generating circuit 42 are inputted to gate terminals of transistors in the transistor groups 41a–41d, respectively.

FIG. 5 is a logic diagram of the address signals A1 and A6, and the outputs PGTn0–PGTn3 and NGTp0–NGTp3 of the control signal generating circuit. As shown in FIG. 5, if the address signals A1 and A6 are in low level, three transistor groups 41a, 41b and 41c in the I/O buffer 11a operates, and driving ability of the I/O buffer 11a becomes the state of "default".

If the address signal A1 is in high level and the address signal A6 is low level, four transistor groups 41a, 41b, 41c and 41d in the I/O buffer 11a operate, and driving ability of the I/O buffer 11a becomes the state of "strong".

If the address signal A1 is in low level, and the address signal A6 is in high level, two transistor groups 41a and 41b in the I/O buffer 11a operates. In this case, the driving ability of the I/O buffer 11a becomes the state of "weaker".

If the address signals A1 and A6 are in high level, only the transistor group 41a in the I/O buffer 11a operates, and the driving ability of the I/O buffer 11a becomes the state of "weakest".

Although FIGS. 4 and 5 has shown the internal configuration of the I/O buffer 11a, the I/O buffer 11b has also the same configuration.

FIG. 6 is a diagram showing timing between the DQS and the DQ outputted from the I/O buffers 11a and 11b in the case of delaying the DQS signal by lengthening the trace length of the data strobe signal DQS in regard to the data signal DQ, and driving the DQS signal with the driving ability optimum to the trace length.

As shown in FIG. 6, the memory 1 of the present embodiment outputs the DQ and the DQS with timing in which the logic of the DQS changes at the vicinity of the center of the valid period of the DQ.

Because of this, even if phase adjustment of the DQ and the DQS is not performed, it is possible to surely acquire the DQ at the edge of the DQS in the controller 2.

In the above mentioned FIGS. 3 and 4, the internal configuration of the I/O buffer 11a has been described. However, the I/O buffer 11b has also the same configuration. It is possible to variably control the driving ability of the I/O buffer 11b by the external address signals A2 and A5.

Thus, according to the present embodiment, the driving ability of the I/O buffer 11a for outputting the DQ and the driving ability of the I/O buffer 11b for outputting the DQS are variably controlled separate from each other. Because of this, as a example, by extending the trace length, it is possible to easily output the DQ and the DQS at timing when the logic of the DQS changes at the vicinity of the center of the data valid period of the DQ. Accordingly, it is unnecessary to perform a complicated timing adjustment of the DQ and the DQS in the controller 2 for transferring data to the memory 1, thereby simplifying the internal configuration of the controller 2.

Furthermore, according to the present embodiment, the driving ability of the I/O buffers 11a and 11b is set by using a potion of the external address signals for designating the addresses of the memory 1. Because of this, a dedicated terminal for setting the driving ability is unnecessary.

What is claimed is:

1. A semiconductor integrated circuit, comprising:
    a first output driving part which outputs a data signal in sync with a reference clock signal;
    a second output driving part which outputs a data strobe signal prescribing a timing of said data signal; and
    a driving control part capable of separately controlling driving ability of said first and second output driving parts based on an external signal.

2. The semiconductor integrated circuit according to claim 1, wherein driving control part includes:
    a first driving control part which controls driving ability of said first output driving part; and
    a second driving control part which controls driving ability of said second output driving part.

3. The semiconductor integrated circuit according to claim 1,
    wherein said first and second output driving parts are a plurality of transistors, respectively, and
    said driving control part controls the driving ability by switching the number of the driven transistors, with regard to each of said first and second output driving parts.

4. The semiconductor integrated circuit according to claim 1,
    wherein said first output driving part has a plurality of first transistor groups each having a PMOS transistor and an NMOS transistor connected in series between first and second reference voltage terminals, a connection point of said PMOS transistor and said NMOS transistor in each of said plurality of first transistor groups being connected to an output terminal of said first output driving part;
    said second output driving part has a plurality of second transistor groups each having a PMOS transistor and an NMOS transistor connected in series between the first and second reference voltage terminals, a connection point of said PMOS transistor and said NMOS transistor in each of said plurality of second transistor groups being connected to an output terminal of said second output driving part; and
    said driving control part controls driving ability of said first and second output driving parts by switching ON/OFF of each of said plurality of first and second transistor groups.

5. The semiconductor integrated circuit according to claim 4,
    wherein said PMOS transistor and said NMOS transistor belonging to the same first transistor group are simultaneously turned on or off;

said PMOS transistor and said NMOS transistor belonging to the same second transistor group are simultaneously turned on or off; and said driving control part controls the driving ability of said first output driving part by switching the number of said first transistor groups simultaneously turned on, and controls the driving ability of said second output driving part by switching the number of said second transistor groups simultaneously turned on.

6. The semiconductor integrated circuit according to claim 4, wherein said driving control part controls the driving ability of said first and second output driving parts in more than two kinds of manners with different driving ability by switching ON/OFF of each of said plurality of first and second transistor groups.

7. The semiconductor integrated circuit according to claim 1, wherein said driving control part controls the driving ability of said first output driving part based on a first address signal, and controls the driving ability of said second output driving part bated on a second address signal.

8. The semiconductor integrated circuit according to claim 7, further comprising first and second address latch circuits which latch said first and second address signals supplied from outside, wherein said driving control part controls the driving ability of said first and second output driving parts based on the address signal latched by said first and second address latch circuits.

9. The semiconductor integrated circuit according to claim 8, wherein said first and second address latch circuits latch said first and second address signals, respectively, only in the case set to a certain mode.

10. A memory system, comprising:

a storage part which outputs a data signal corresponding to a designated address and a data strobe signal prescribing a timing of said data signal;

a first output driving part which outputs said data signal in sync with a reference clock signal;

a second output driving part which outputs said data strobe signal in sync with said data signal; and a driving control part separately controlling driving ability of said first and second output driving parts based on an external signal.

11. The memory system according to claim 10, wherein said storage part is a DDR SDRAM (Double Data Rate Synchronous DRAM).

12. The memory system according to claim 10, wherein driving control part includes:

a first driving control part which controls driving ability of said first output driving part; and a second driving control part which controls driving ability of said second output driving part.

13. The memory system according to claim 10, wherein said first and second output driving parts are a plurality of transistors, respectively, and said driving control part controls the driving ability by switching the number of the driven transistors, with regard to each of said first and second output driving parts.

14. The memory system according to claim 10, wherein said first output driving part has a plurality of first transistor groups each having a PMOS transistor and an NMOS transistor connected in series between first and second reference voltage terminals, a connection point of said PMOS transistor and said NMOS transistor in each of said plurality of first transistor groups being connected to an output terminal of said first output driving part;

said second output driving part has a plurality of second transistor groups each having a PMOS transistor and an NMOS transistor connected in series between the first and second reference voltage terminals, a connection point of said PMOS transistor and said NMOS transistor in each of said plurality of second transistor groups being connected to an output terminal of said second output driving part; and said driving control part controls driving ability of said first and second output driving parts by switching ON/OFF of each of said plurality of first and second transistor groups.

15. The memory system according to claim 14, wherein said PMOS transistor and said NMOS transistor belonging to the same first transistor group are simultaneously turned on or off;

said PMOS transistor and said NMOS transistor belonging to the same second transistor group are simultaneously turned on or off; and said driving control part controls the driving ability of said first output driving part by switching the number of said first transistor groups simultaneously turned on, and controls the driving ability of said second output driving part by switching the number of said second transistor groups simultaneously turned on.

16. The memory system according to claim 14, wherein said driving control part controls the driving ability of said first and second output driving parts in more than two kinds of manners with different driving ability by switching ON/OFF of each of said plurality of first and second transistor groups.

17. The memory system according to claim 10, wherein said driving control part controls the driving ability of said first output driving part based on a first address signal, and controls the driving ability of said second output driving part based on a second address signal.

18. The memory system according to claim 17, further comprising first and second address latch circuits which latch said first and second address signals supplied from outside, wherein said driving control part controls the driving ability of said first and second output driving parts based on the address signal latched by said first and second address latch circuits.

19. The memory system according to claim 18, wherein said first and second address latch circuits latch said first and second address signals, respectively, only in the case set to a certain mode.

* * * * *